(12) United States Patent
Hoshino et al.

(10) Patent No.: US 7,911,281 B2
(45) Date of Patent: Mar. 22, 2011

(54) PLL CIRCUIT AND RADIO COMMUNICATION APPARATUS

(75) Inventors: Hiroaki Hoshino, Yokohama (JP);
 Osamu Watanabe, Chigasaki (JP);
 Shoji Otaka, Yokohama (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 12/558,771

(22) Filed: Sep. 14, 2009

(65) Prior Publication Data
 US 2010/0164633 A1 Jul. 1, 2010

(30) Foreign Application Priority Data
 Dec. 25, 2008 (JP) ................ P2008-330652

(51) Int. Cl.
 *H03B 5/12* (2006.01)
 *H03B 27/00* (2006.01)
 *H03L 7/18* (2006.01)
(52) U.S. Cl. ....... 331/16; 331/36 C; 331/45; 331/117 R; 331/117 FE; 331/177 V
(58) Field of Classification Search ............... 331/2, 8, 331/16–18, 25, 36 C, 45, 46, 55, 117 R, 117 FE, 331/117 D, 167, 172, 177 R, 177 V
 See application file for complete search history.

(56) References Cited

U.S. PATENT DOCUMENTS

| 7,383,033 | B2 * | 6/2008 | Holger | 455/264 |
| 2006/0238259 | A1 * | 10/2006 | Metaxakis | 331/2 |
| 2010/0225366 | A1 * | 9/2010 | Schnaitter et al. | 327/116 |

OTHER PUBLICATIONS

Helleputte, et al. An Ultra-low-Power Quadrature PLL in 130nm CMOS for Impulse Radio Receivers, IEEE Biomedical Circuits and Systems Conference, 2007, pp. 63-66.

* cited by examiner

*Primary Examiner* — David Mis
(74) *Attorney, Agent, or Firm* — Turocy & Watson, LLP (57) ABSTRACT

A PLL circuit includes: a voltage-controlled oscillator including: a first oscillating portion configured to generate first differential signals; and a second oscillating portion configured to generate second differential signals with a phase difference of 90 degrees from the first differential signals; a phase detector configured to compare phases of third differential signals based on the first and second differential signals with a phase of a reference signal; and a loop filter configured to generate a control voltage for controlling the voltage-controlled oscillator based on a result of the comparison in the phase detector.

11 Claims, 10 Drawing Sheets

PLL CIRCUIT AND RADIO COMMUNICATION APPARATUS

CROSS-REFERENCE TO THE RELATED APPLICATION(S)

The present disclosure relates to the subject matters contained in Japanese Patent Application No. 2008-330652 filed on Dec. 25, 2009, which are incorporated herein by reference in its entirety.

FIELD

The present invention relates to a PLL circuit and a radio communication apparatus.

BACKGROUND

There is known a method using a Phase Locked Loop (PLL) circuit in a local oscillator of a quadrature modulator-demodulator (modem) in a radio communication apparatus. Generally, in a local oscillator of a quadrature modem, a phase shifter is used so that an output signal of the PLL circuit and a signal with a phase difference of 90 degrees from the output signal are generated.

When local oscillation signals with a phase difference of 90 degrees from each other are generated, it is necessary to use a phase shifter as described above. There is a problem that a phase error in the local oscillator increases when accuracy of the phase shifter is worse.

Therefore, a PLL circuit using a Quadrature Voltage-Controlled Oscillator (QVCO) for outputting four-phase oscillation signals (differential signals with a phase difference of 90 degrees from one another) from one voltage-controlled oscillator by cross-coupling a pair of voltage-controlled oscillating circuits has been proposed. An example of such PLL circuit is disclosed in the following Related-Art Document 1 listed below.

Related-Art Document 1: IEEE Biomedical Circuits and Systems Conference, 2007, pp. 63-66

The PLL circuit disclosed in the Related-Art Document 1 uses a QVCO as an oscillator so that four-phase oscillation signals can be output without use of any phase shifter.

In the PLL circuit described in Related-Art Document 1, one of the four-phase oscillation signals output from the QVCO is however frequency-divided so as to be fed back to a phase frequency detector. When one (which is assumed to be a Q– oscillation signal here) of the four-phase output signals is input to a frequency divider, the load condition of the output terminal connected to the frequency divider, that is, at the output terminal A at which the Q– oscillation signal is output becomes different from the load conditions of the other output terminals B to D which are not connected to the frequency divider.

Accordingly, the phase difference and amplitude difference of the oscillation signal output at the output terminal A from the oscillation signals output at the output terminals B to D increase. That is, because the difference between the signal fed back and the real output signal increases, there arises a problem that the phase difference between the oscillation signals output from the PLL circuit is shifted from a required phase difference.

SUMMARY

According to a first aspect of the invention, there is provided a PLL circuit including: a voltage-controlled oscillator including: a first oscillating portion configured to generate first differential signals; and a second oscillating portion configured to generate second differential signals with a phase difference of 90 degrees from the first differential signals; a phase detector configured to compare phases of third differential signals based on the first and second differential signals with a phase of a reference signal; and a loop filter configured to generate a control voltage for controlling the voltage-controlled oscillator based on a result of the comparison in the phase detector.

According to a second aspect of the invention, there is provided a radio communication apparatus including: an antenna configured to receive a radio signal; an amplifier configured to generate an amplified signal by amplifying the radio signal; a PLL circuit comprising: a voltage-controlled oscillator including: a first oscillating portion configured to generate first differential signals; and a second oscillating portion configured to generate second differential signals with a phase difference of 90 degrees from the first differential signals; a phase detector configured to compare phases of third differential signals based on the first and second differential signals with a phase of a reference signal; and a loop filter configured to generate a control voltage for controlling the voltage-controlled oscillator based on a result of the comparison in the phase detector; a first mixer circuit configured to generate a first reception signal by downconverting the amplified signal by the first differential signals; and a second mixer circuit configured to generate a second reception signal by downconverting the amplified signal by the second differential signals.

BRIEF DESCRIPTION OF THE DRAWINGS

A general configuration that implements the various feature of the invention will be described with reference to the drawings. The drawings and the associated descriptions are provided to illustrate embodiments of the invention and not to limit the scope of the invention.

DETAILED DESCRIPTION OF THE EMBODIMENTS

Hereinafter, embodiments of the invention will be described with reference to the drawings. In the following description, the same or similar components will be denoted by the same reference numerals, and the duplicate description thereof will be omitted.

First Embodiment

Figure 1:
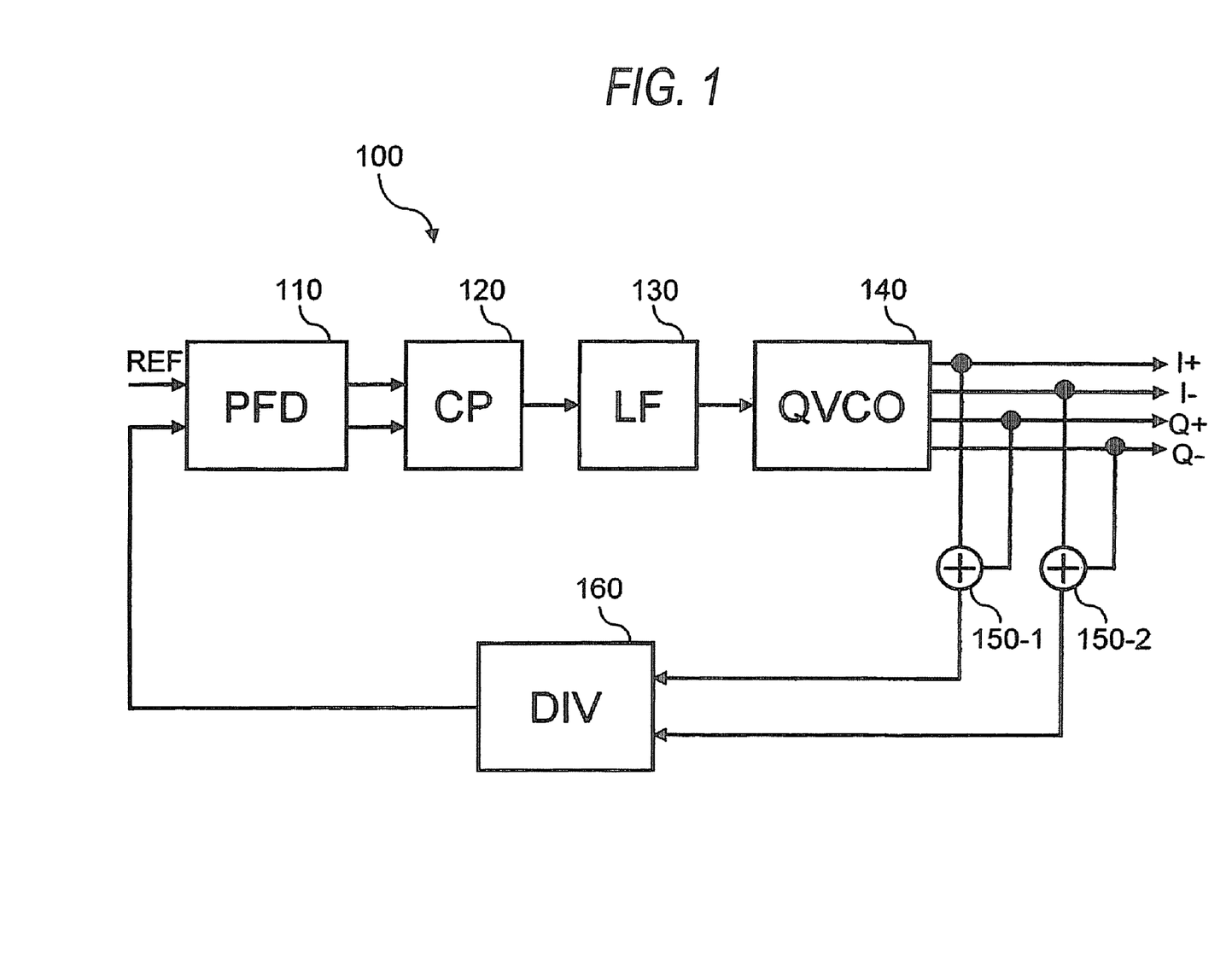
FIG. 1 is a block diagram showing a PLL circuit according to a first embodiment of the invention.

A first embodiment of the invention will be described with reference to FIGS. 1 to 5. FIG. 1 is a block diagram of a PLL circuit 100 according to this embodiment.

The PLL circuit 100 shown in FIG. 1 has a phase frequency detector (PFD) 110, a charge pump (CP) 120, a loop filter (LF) 130, a quadrature voltage-controlled oscillator (QVCO) 140, adders 150-1 and 150-2, and a frequency divider (DIV) 160.

The phase frequency detector 110 has a function of comparing a signal output from the frequency divider 160 with a reference signal (REF) output from a reference signal oscillator (TCXO: Temperature Compensated Crystal Oscillator) not shown and outputting a pulse signal for controlling the charge pump 120 (following the phase frequency detector 110 based on a result of the comparison. In the example shown in FIG. 1, the phase frequency detector 110 generates a pulse signal for controlling the charge pump 120 based on phase difference information (phase lead and phase lag) between the reference signal (REF) and an oscillation signal of the oscillator 140 frequency-divided by the frequency divider 160.

Figure 2:
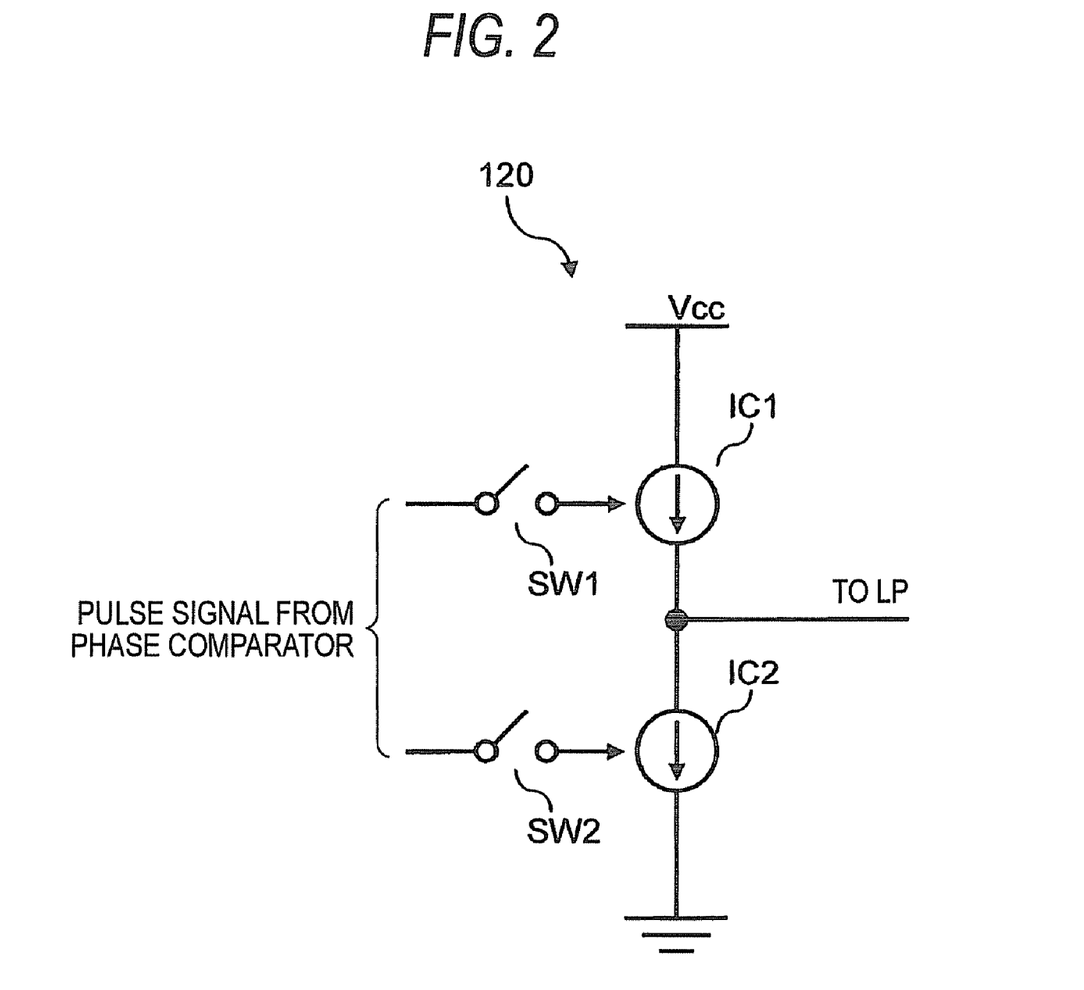
FIG. 2 is a diagram showing a charge pump according to the first embodiment of the invention.

An example of the charge pump 120 will be described with reference to FIG. 2. The charge pump 120 has current sources IC1 and IC2, and current control switches SW1 and SW2 for turning on/off the current sources IC1 and IC2 respectively.

The current source IC1 has one end connected to a power supply (Vcc), and the other end connected to the current source IC2 and the loop filter 130. The current source IC1 has a function of accumulating charge to the loop filter 130. On the other hand, the current source IC2 has one end connected to the other end of the current source IC1 and the loop filter 130, and the other end grounded. The current source IC2 has a function of removing charge from the loop filter 130.

For example, when a phase lag is detected in the oscillator 140 as a result of the phase comparison performed by the phase frequency detector 110, the phase frequency detector 110 performs control so that the switch SW1 is turned on. On the other hand, when a phase lead is detected in the oscillator 140, the phase frequency detector 110 performs control so that the switch SW2 is turned on. That is, when the switch SW1 is turned on in the condition that a phase lag is detected in the oscillator 140, the current source IC1 operates so that the charge pump 120 operates as a whole to supply charge to the loop filter 130. On the other hand, when the switch SW2 is turned on in the condition that a phase lead is detected in the oscillator 140, the current source IC2 operates so that the charge pump 120 operates as a whole to remove charge from the loop filter 130.

In this manner, the charge pump 120 has a function of supplying a positive or negative control signal to the oscillator 140 (i.e. a control signal feeding/drawing-out function) in accordance with a result of the phase comparison in the phase frequency detector 110.

Figure 3:
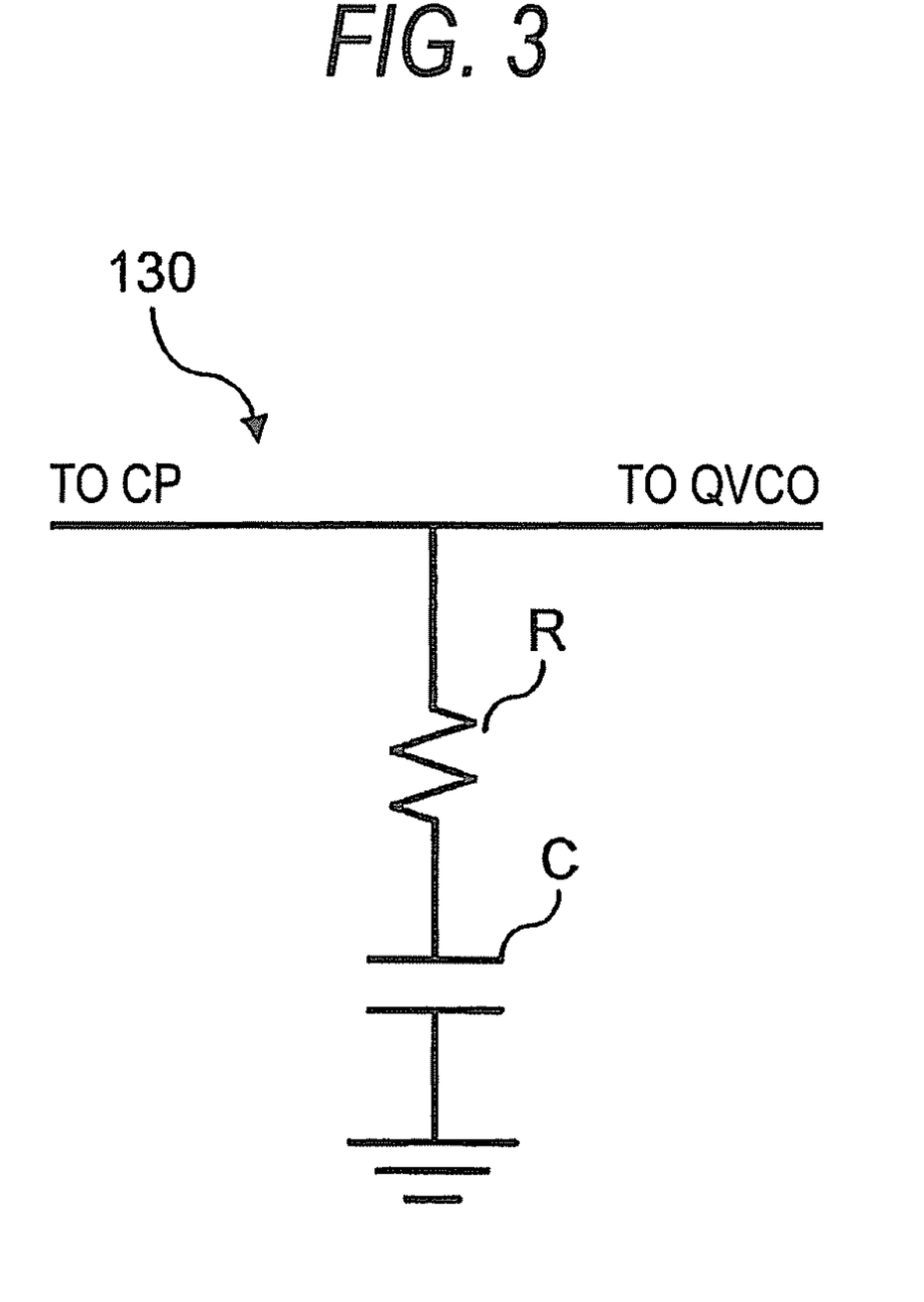
FIG. 3 is a diagram showing a loop filter according to the first embodiment of the invention.

An example of the loop filter 130 will be described next with reference to FIG. 3. In FIG. 3, the loop filter 130 has a resistor R and a capacitor C connected in series to each other. The loop filter 130 serves as a low-pass filter (LPF) which smoothes a charge output from the charge pump 120 to generate a control voltage signal for the oscillator 140.

The resistor R has one end connected to an output of the charge pump 120, and the other end connected to one end of the capacitor C. The other end of the capacitor C is grounded.

The loop filter 130 converts a positive or negative charge fed from the charge pump 120 into a control voltage to thereby generate a control voltage signal. The loop filter 130 also serves to remove switching noise, clock noise, thermal noise, etc. in the charge pump 120.

Figure 4:
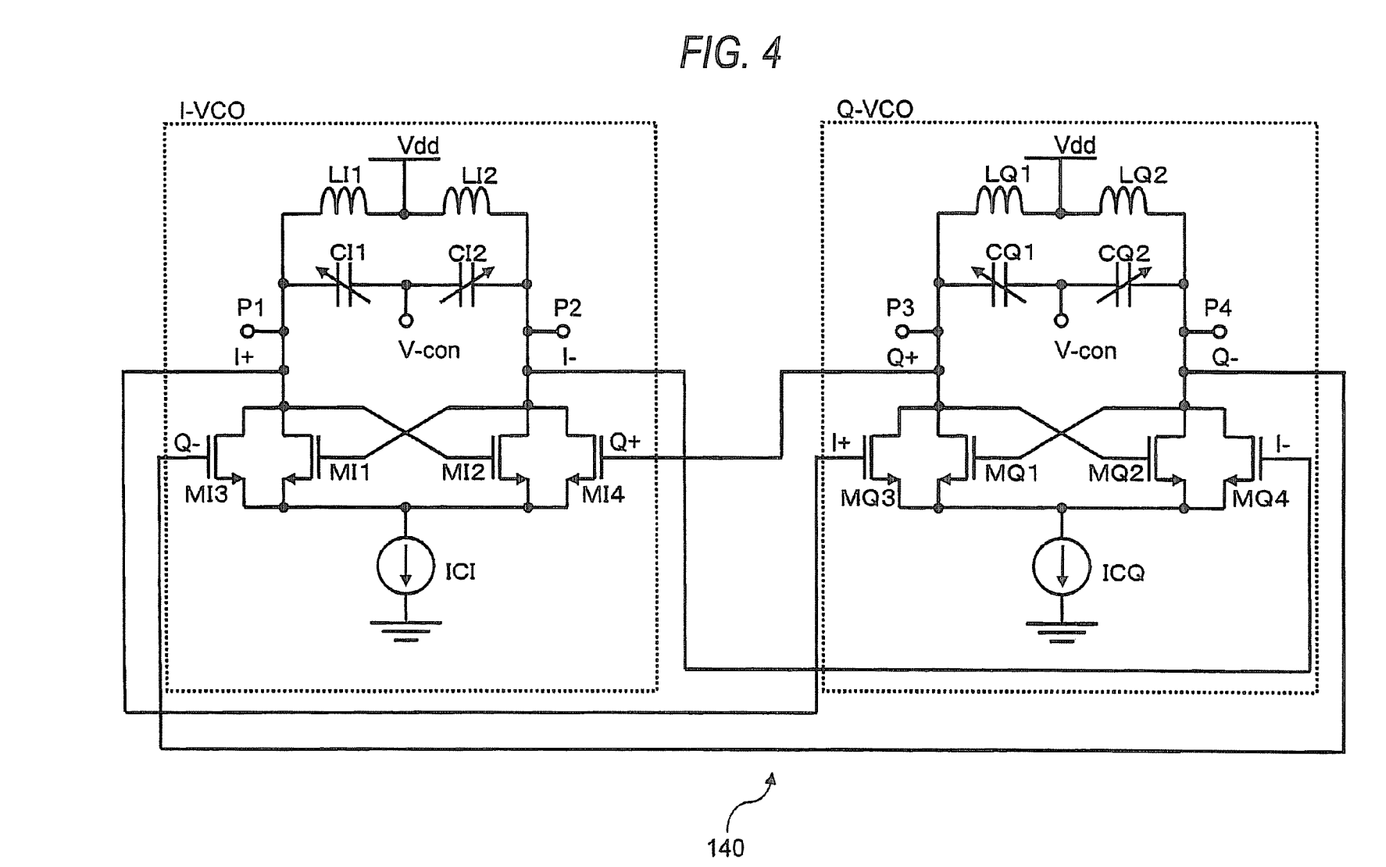
FIG. 4 is a diagram showing an oscillator according to the first embodiment of the invention.

An example of the oscillator 140 will be described with reference to FIG. 4. In FIG. 4, the oscillator 140 is a voltage-controlled oscillator called QVCO (Quadrature Voltage-Controlled Oscillator) for generating quadrature phase signals (I+, I−, Q+ and Q−). Specifically, the oscillator 140 has a first oscillating portion I-CVO for outputting I+ and I− signals, and a second oscillating portion Q-VCO for outputting Q+ and Q− signals.

The first oscillating portion I-VCO has a first output terminal P1, a second output terminal P2, an input terminal Vcon, inductors $L_{I1}$ and $L_{I2}$, variable capacitors $C_{I1}$ and $C_{I2}$, nMOS transistors $M_{I1}$ to $M_{I4}$, and a current source $IC_I$.

A series circuit of the inductors $L_{I1}$ and $L_{I2}$ and a series circuit of the variable capacitors $C_{I1}$ and $C_{I2}$ are connected in parallel to each other. That is, the inductor $L_{I1}$ has one end connected to one end of the variable capacitor $C_{I1}$, and the other end connected to one end of the inductor $L_{I2}$ and a power supply (Vdd). The inductors $L_{I1}$ and $L_{I2}$ and the variable capacitors $C_{I1}$ and $C^{I2}$ form a first resonance portion. The other end of the variable capacitor $C_{I1}$ is connected to one end of the variable capacitor $C_{I2}$ and the input terminal Vcon. The other end of the inductor $L_{I2}$ is connected to the other end of the variable capacitor $C_{I2}$. Incidentally, the input terminal Vcon is connected to an output terminal of the loop filter 130.

Each of the nMOS transistors $M_{I1}$ and $M_{I3}$ has a drain terminal connected to one end of the inductor $L_{I1}$ and one end of the variable capacitor $C_{I1}$, and a source terminal connected to one end of the current source $IC_I$. A gate terminal of the nMOS transistor $M_{I3}$ is connected to a fourth output terminal P4 of the second oscillating portion Q-VCO which will be described later. A gate terminal of the nMOS transistor $M_{I1}$ is connected to respective drain terminals of the nMOS transistors $M_{I2}$ and $M_{I4}$, that is, the second output terminal P2 of the I-VCO.

Each of the nMOS transistors $M_{I2}$ and $M_{I4}$ has a drain terminal connected to the other end of the inductor $L_{I2}$ and the other end of the variable capacitor $C_{I2}$, and a source terminal connected to one end of the current source $IC_I$. A gate terminal of the nMOS transistor $M_{I4}$ is connected to a third output terminal P3 of the second oscillating portion Q-VCO which will be described later. A gate terminal of the nMOS transistor $M_{I2}$ is connected to the respective drain terminals of the nMOS transistors $M_{I1}$ and $M_{I3}$, that is, the first output terminal P1 of the I-VCO.

The current source $IC_I$ has one end connected to the nMOS transistors $M_{I1}$ to $M_{I4}$, and the other end grounded.

The second oscillating portion Q-VCO has a third output terminal P3, a fourth output terminal P4, an input terminal Vcon, inductors $L_{Q1}$ and $L_{Q2}$, variable capacitors $C_{Q1}$ and $C_{Q2}$, nMOS transistors $M_{Q1}$ to $M_{Q4}$, and a current source $IC_Q$.

A series circuit of the inductors $L_{Q1}$ and $L_{Q2}$ and a series circuit of the variable capacitors $C_{Q1}$ and $C_{Q2}$ are connected in parallel to each other. That is, the inductor $L_{Q1}$ has one end connected to one end of the variable capacitor $C_{Q1}$, and the other end connected to one end of the inductor $LQ2$ and the power supply (Vdd). The inductors $L_{Q1}$ and $L_{Q2}$ and the variable capacitors $C_{Q1}$ and $C_{Q2}$ form a second resonance portion. The other end of the variable capacitor $C_{Q1}$ is connected to one end of the variable capacitor $C_{Q2}$ and the input terminal Vcon. The other end of the inductor $L_{Q2}$ is connected to the other end of the variable capacitor $C_{Q2}$. Incidentally, the input terminal Vcon is connected to the output terminal of the loop filter 130.

Each of the nMOS transistors $M_{Q1}$ and $M_{Q3}$ has a drain terminal connected to one end of the inductor $L_{Q1}$ and one end of the variable capacitor $C_{Q1}$, and a source terminal connected to one end of the current source $IC_Q$. A gate terminal of the nMOS transistor $M_{Q3}$ is connected to the first output terminal P1 of the first oscillating portion I-VCO. A gate terminal of the nMOS transistor $M_{Q1}$ is connected to respective drain terminals of the nMOS transistors $M_{Q2}$ and $M_{Q4}$, that is, the fourth output terminal P4 of the Q-VCO.

Each of the nMOS transistors $M_{Q2}$ and $M_{Q4}$ has a drain terminal connected to the other end of the inductor $L_{Q2}$ and the other end of the variable capacitor $C_{Q2}$, and a source terminal connected to one end of the current source $IC_Q$. A gate terminal of the nMOS transistor $M_{Q4}$ is connected to the second output terminal P2 of the first oscillating portion I-VCO. A gate terminal of the nMOS transistor $M_{Q2}$ is connected to the respective drain terminals of the nMOS transistors $M_{Q1}$ and $M_{Q3}$, that is, the third output terminal P3 of the Q-VCO.

The current source ICQ has one end connected to the nMOS transistors $M_{Q1}$ to $M_{Q4}$ and the other end grounded.

The action of respective constituent members of the first oscillating portion I-VCO will be described below. Description of the action of respective constituent members of the second oscillating portion Q-VCO will be omitted because the action of respective constituent members of the second oscillating portion Q-VCO is substantially the same as that of the respective constituent members of the first oscillating portion I-VCO.

First, in the first oscillating portion I-VCO, the series circuit of the inductors $L_{I1}$ and $L_{I2}$ and the series circuit of the variable capacitors $C_{I1}$ and $C_{I2}$ are connected in parallel to each other so as to operate as an LC resonance circuit (first resonance portion). The first resonance portion oscillates AC signals at a resonance frequency defined based on inductance of the inductors $L_{I1}$ and $L_{I2}$ and capacitance of the variable capacitors $C_{I1}$ and $C_{I2}$. The AC signals are output at the output terminals P1 and P2. The AC signals output at the output terminals P1 and P2 are reverse to each other in terms of phase.

The nMOS transistors $M_{I1}$ and $M_{I2}$ serve as negative resistance in the first resonance portion configured by the inductors $L_{I1}$ and $L_{I2}$ and the variable capacitors $C_{I1}$ and $C_{I2}$. Because the nMOS transistors $M_{I1}$ and $M_{I2}$ compensate for loss in the first resonance portion, oscillation in the first resonance portion continues.

In the oscillator 140, the output terminals P1 and P2 of the first oscillating portion I-VCO are connected to the gate terminals of the nMOS transistors $M_{Q3}$ and $M_{Q4}$ of the second oscillating portion Q-VCO, respectively. The output terminals P3 and P4 of the second oscillating portion Q-VCO are connected to the gate terminals of the nMOS transistors $M_{I4}$ and $M_{I3}$ of the first oscillating portion I-VCO, respectively. That is, a Q− signal and a Q+ signal are applied to the gate terminals of the nMOS transistors $M_{I3}$ and $M_{I4}$ of the first oscillating portion I-VCO, respectively. An I+ signal and an I− signal are applied to the gate terminals of the nMOS transistors $M_{Q3}$ and $M_{Q4}$ of the second oscillating portion Q-VCO, respectively.

By cross-coupling the output terminals of the first and second oscillating portions and the gate terminals of the transistors in this manner, the phase of the output signals of the first oscillating portions I-VCO and the phase of the output signals of the second oscillating portions Q-VCO can be shifted by 90 degrees from each other. That is, the phase difference between the differential oscillation signals (first differential signals) I+ and I− output from the first oscillating portion I-VCO and the differential oscillation signals (second differential signals) Q+ and Q− output from the second oscillating portion Q-VCO becomes 90 degrees. For example, four-phase signals I+, I−, Q+ and Q− as shown in FIG. 5 are output at the output terminals P1 to P4 respectively.

Referring back to FIG. 1, the adder 150-1 adds up the I+ signal and the Q+ signal output at the output terminals P1 and P3 from the oscillator 140 and outputs a thus obtained sum signal to the frequency divider. The adder 150-2 adds up the I− signal and the Q− signal output at the output terminals P2 and P4 from the oscillator 140 and outputs a thus obtained sum signal to the frequency divider 160.

Figure 5:
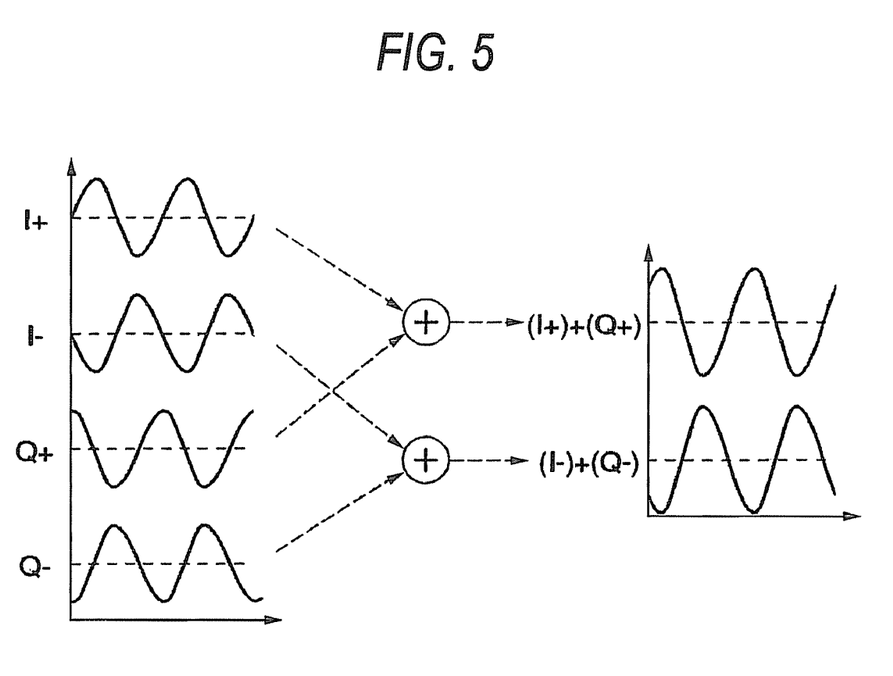
FIG. 5 is a graph showing waveforms of input/output signals of adders according to the first embodiment of the invention.

FIG. 5 shows input signal waveforms and output signal waveforms of the adders 150-1 and 150-2. As shown in FIG. 5, the sum signal obtained by adding up the I+ signal and the Q+ signal and the sum signal obtained by adding up the I− signal and the Q− signal are reverse to each other in terms of phase. Hereinafter, the result of the addition of the I+ signal and the Q+ signal is referred to as positive phase signal whereas the result of the addition of the I− signal and the Q− signal is referred to as negative phase signal.

The frequency divider 160 frequency-divides the sum signals given from the adders 150-1 and 150-2 at a predetermined frequency-dividing ratio and outputs a frequency-divided signal to the phase frequency detector 110.

The operation of the PLL circuit according to this embodiment will be described next. In the four-phase oscillation signals (I+ signal, I− signal, Q+ signal and Q− signal) output from the oscillator 140, the I+ signal and the Q+ signal are added up by the adder 150-1 and the sum signal is fed as a positive phase signal to the frequency divider 160. The I− signal and the Q− signal are added up by the adder 150-2 and the thus obtained sum signal is fed as a negative phase signal to the frequency divider 160. Incidentally, the positive phase signal and the negative phase signal are generically referred to as third differential signals.

Each of the positive phase signal and the negative phase signal is frequency-divided at a predetermined frequency dividing ratio by the frequency divider 160. The frequency dividing ratio is determined based on the frequency of a TCXO (not shown) as a reference used for comparison. The frequency-divided signal output from the frequency divider 160 is input to the phase frequency detector 110.

In the phase frequency detector 110, the frequency-divided signal is compared with the reference signal output from the TCXO (not shown). When a phase lag of the frequency-divided signal from the reference signal is detected as a result of the comparison, that is, when a phase lag is found in an oscillation signal of the oscillator 140 in comparison with a desired phase, the phase frequency detector 110 outputs a control signal for turning on the switch SW1 of the charge pump 120. On the other hand, when a phase lead of the frequency-divided signal from the reference signal is found, that is, a phase lead is found in an oscillation signal of the oscillator 140 in comparison with a desired phase, the phase frequency detector 110 outputs a control signal for turning on the switch SW2 of the charge pump 120.

Either of the switches SW1 and SW2 of the charge pump 120 is turned on based on the control signal. When the switch S1 is turned on (a phase lag is found in the oscillation signal), the current source $I_{C1}$ operates so that the charge pump 120 feeds a charge to the loop filter 130. That is, the charge pump 120 feeds a positive charge to the loop filter 130. When the switch SW2 is turned on (a phase lead is found in the oscillation signal), the current source $I_{C2}$ operates so that a charge is removed from the loop filter 130. That is, the charge pump 120 feeds a negative charge to the loop filter 130.

The positive or negative charge fed from the charge pump 120 is smoothed and converted into a control voltage signal by the loop filter 130, so that the control voltage signal is fed to the oscillator 140.

Capacitance values of the variable capacitors $C_{I1}$, $C_{I2}$, $C_{Q1}$ and $C_{Q2}$ in the oscillator 140 are controlled in accordance with the control voltage signal. As a result, the oscillation frequency of the oscillator 140 is controlled so that a desired oscillation signal is obtained.

As described above, in accordance with the first embodiment, load conditions for the output terminals of the oscillator 140 can be substantially equalized by addition of I+ and Q+ signals and addition of I− and Q− signals in four-phase oscillation signals output from the oscillator 140, so that phase error and amplitude error in each of the oscillation signals can be reduced.

For example, if configuration is made so that anyone (e.g. I+ signal) of the four-phase oscillation signals is singly fed back to the frequency divider 160, the value of parasitic capacitance (or parasitic resistance) generated in the I+ signal output terminal will become different from the value of parasitic capacitance (or parasitic resistance) generated in any other output terminal. For this reason, a difference will be generated between the phase/amplitude value of the I+ signal and the phase/amplitude value of any one of the remaining three-phase oscillation signals.

On the contrary, the PLL circuit 100 according to this embodiment is configured so that all the four-phase oscillation signals are fed back to the frequency divider 160. Accordingly, the values of parasitic capacitance (or parasitic resistance) generated in the output terminals of the oscillator 140 can be substantially equalized. For this reason, the difference between the phase/amplitude values of the four-phase oscillation signals can be reduced, so that the oscillation signals can be output with high accuracy.

Second Embodiment

A second embodiment of the invention will be described next with reference to FIGS. 6 to 8. The point of difference of this embodiment from the first embodiment lies in that square signals (third differential signals) obtained by squaring oscillation signals (first differential signals and second differential signals) of an oscillator 240 are output to a frequency divider.

Figure 6:
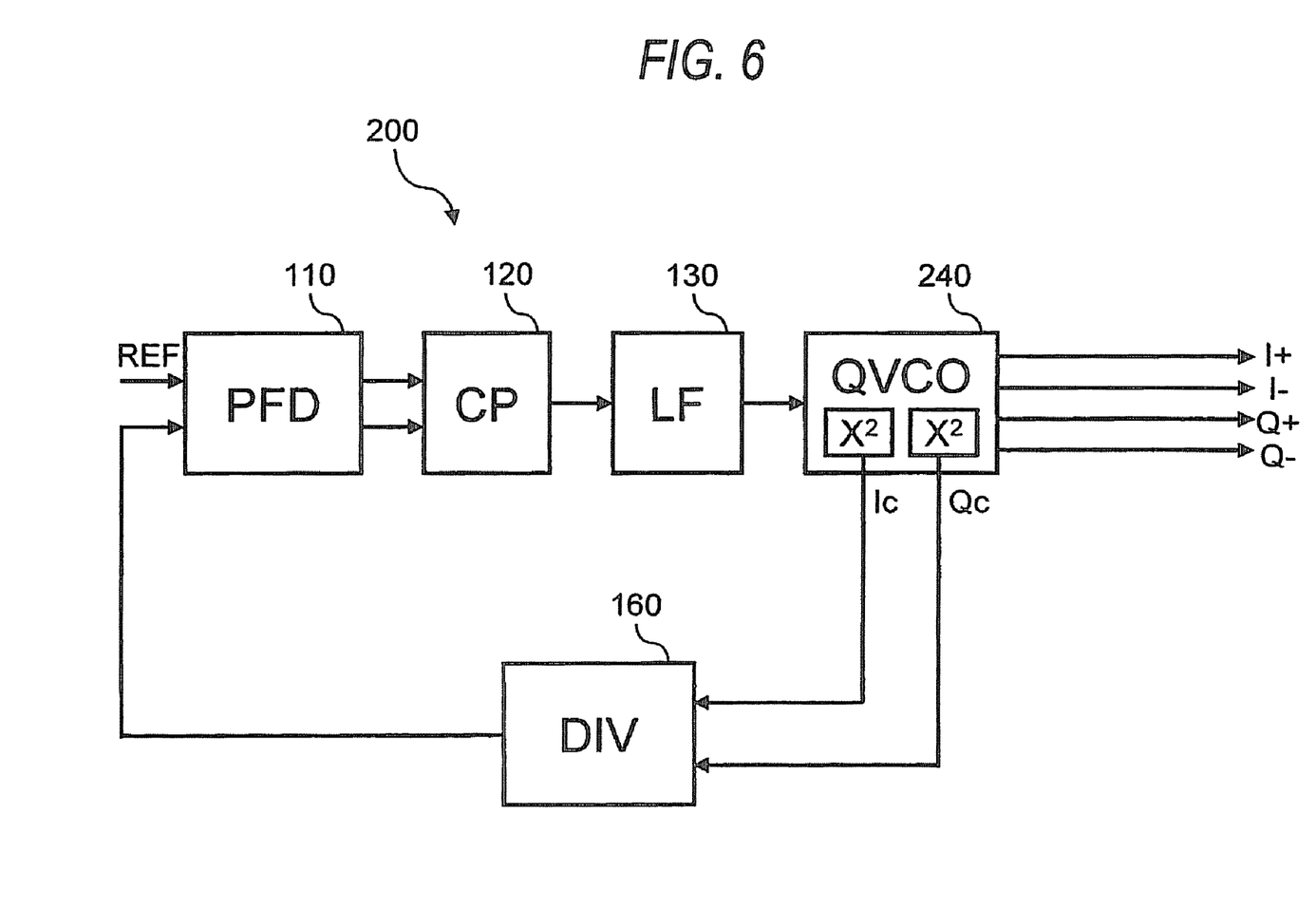
FIG. 6 is a block diagram showing a PLL circuit according to a second embodiment of the invention.
Figure 7:
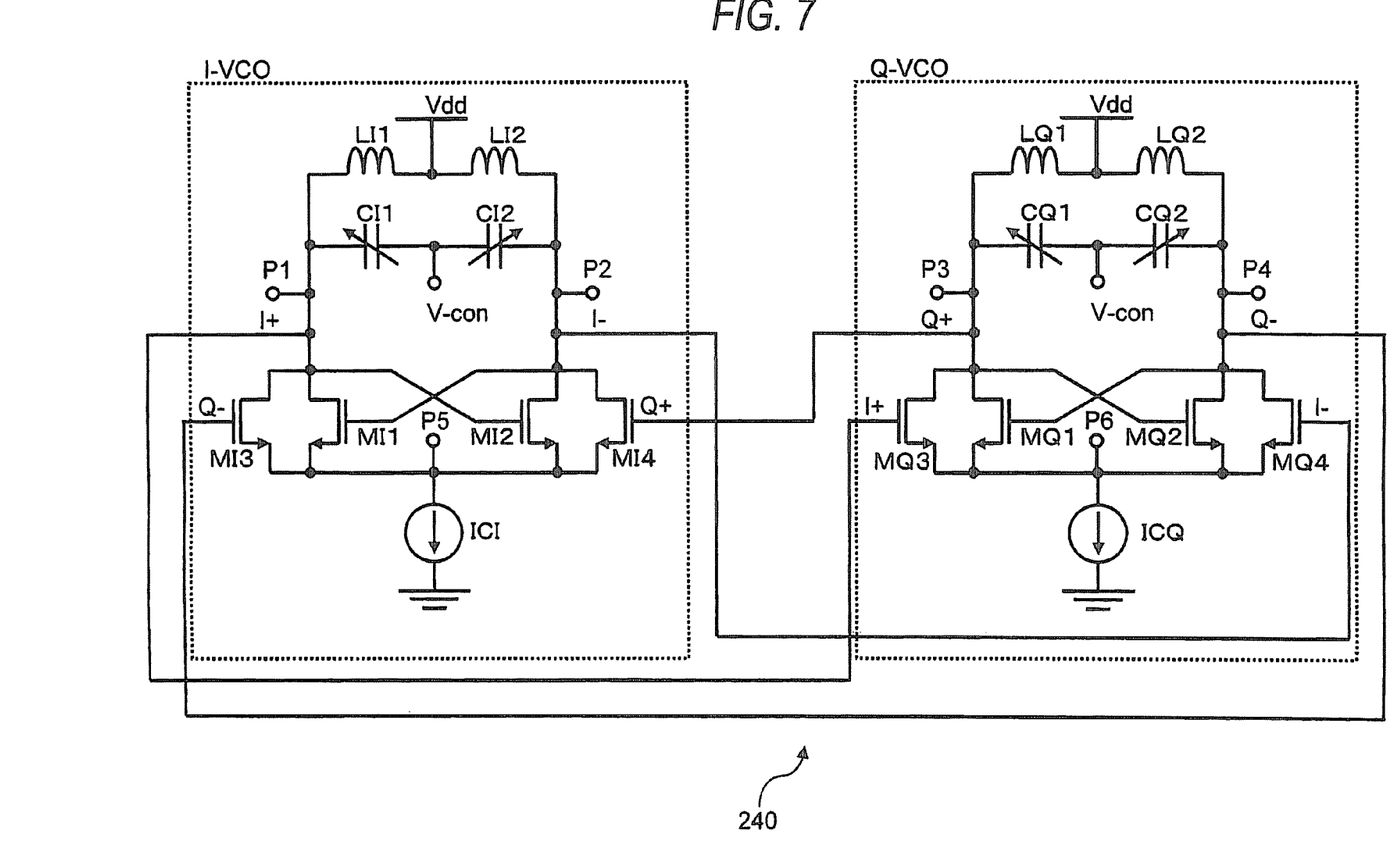
FIG. 7 is a diagram showing an oscillator according to the second embodiment of the invention.

FIG. 6 is a block diagram of a PLL circuit 200 according to this embodiment. The configuration and operation of the PLL circuit 200 shown in FIG. 6 are the same as those of the PLL circuit 100 shown in FIG. 1 except that the adders 150-1 and 150-2 are not provided and configuration of the oscillator 240 is different. Accordingly, like parts are referred to by like numerals for the sake of omission of duplicate description.

The oscillator 240 outputs four-phase oscillation signals (first differential signals (I+ and I−) and second differential signals (Q+ and Q−)) in the same manner as the oscillator 140 shown in FIG. 1 and further outputs a square signal Ic of the I+ or I− signal and a square signal Qc of the Q+ or Q− signal.

The oscillator 240 will be described below in detail with reference to FIG. 7. The configuration of the oscillator 240 shown in FIG. 7 is the same as that of the oscillator 140 shown in FIG. 4, except that a fifth output terminal P5 and a sixth output terminal P6 are provided at one and of the current source $IC_I$ and one end of the current source $IC_Q$, respectively. Accordingly, detailed description of the configuration of the oscillator 240 will be omitted.

The provision of the fifth output terminal P5 of the first oscillating portion I-VCO and the sixth output terminal P6 of the second oscillating portion Q-VCO permits the oscillator 240 to obtain second harmonic signals with a frequency twice as much as the oscillation signals, that is, to obtain square signals Ic and Qc.

Figure 8:
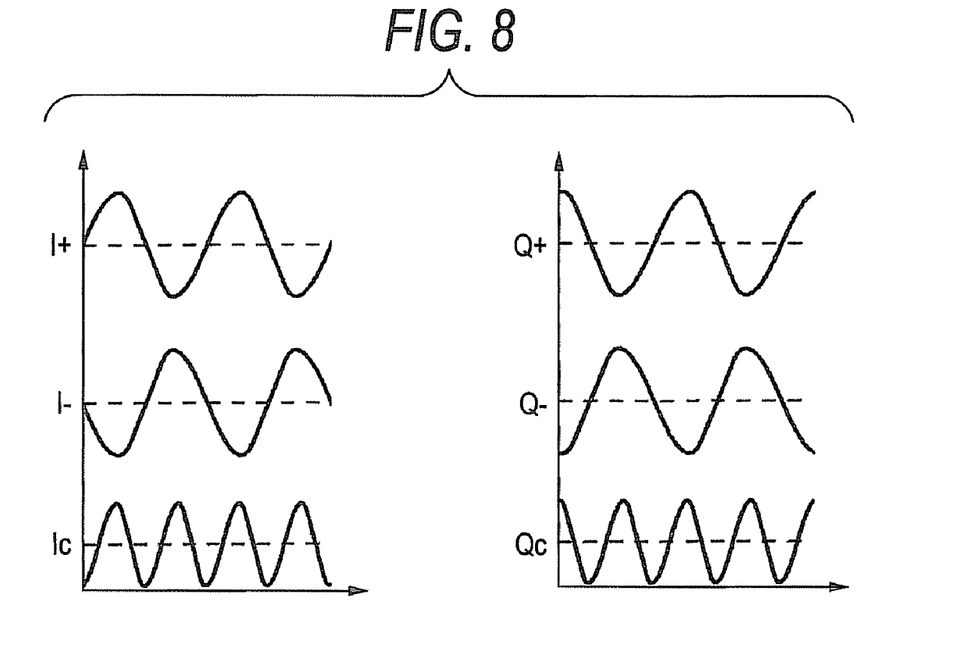
FIG. 8 is a graph showing waveforms of output signals of the oscillator according to the second embodiment of the invention.

FIG. 8 shows waveforms of signals output at respective output terminals. When the I+ signal output at the first output terminal P1 is a sine wave signal, a signal (I− signal) reverse in phase to the I+ signal is output at the second output terminal P2. A signal with a frequency twice as much as the I+ signal, that is, a second harmonic (square signal Ic) of the I+ signal is output at the fifth output terminal P5. Incidentally, the square signal Ic is also a second harmonic signal of the I− signal.

A Q+ signal with a phase difference of 90 degrees from the I+ signal is output at the third output terminal P3. A signal (Q− signal) reverse in phase to the Q+ signal is output at the fourth output terminal P4. A signal with a frequency twice as much as the Q+ signal, that is, a second harmonic (square signal Qc) of the Q+ signal is output at the sixth output terminal P6. Incidentally, the square signal Qc is also a second harmonic signal of the Q− signal.

The square signal Ic output at the fifth output terminal P5 and the square signal Qc output at the sixth output terminal P6 are reverse to each other in terms of phase. Accordingly, the square signals Ic and Qc are referred to as third differential signals.

In this embodiment, the output terminals are provided at one end of the current source ICI of the first oscillating portion I-VCO and one end of the current source ICQ of the second oscillating portion Q-VCO, respectively, in the oscillator 240 so that the square signals Ic and Qc output at the output terminals are input to the frequency divider 160. Although the frequency of the signals input to the frequency divider 160 is different from that in the PLL circuit 100 shown in FIG. 1, the frequency dividing ratio in the frequency divider 160 can be adjusted in this case to obtain a frequency-divided signal with the same frequency (phase) as that of the frequency-divided signal in the PLL circuit 100 shown in FIG. 1.

Although this embodiment has been described in the case where the square signals are taken out from the source terminals of the transistors $M_{I1}$ to $M_{I4}$ and $M_{Q1}$ to $M_{Q4}$ of the first and second oscillating portions, configuration may be made so that the square signal Ic is taken out from a junction between the inductors $L_{I1}$ and $L_{I2}$ and the square signal Qc is taken out from a junction between the inductors $L_{Q1}$ and $L_{Q2}$.

As described above, in accordance with the second embodiment, the provision of the new output terminals in the oscillator 240 permits removal of the adders required in the first embodiment so that the circuit area can be reduced, in addition to the same effect as in the first embodiment. In addition, because there is no adder connected to output terminals for oscillation signals, the values of parasitic capacitance (or parasitic resistance) generated in output terminals for oscillation signals can be reduced.

Although this embodiment has been described in the case where signals output to the frequency divider are square signals Ic and Qc which are second harmonic signals, any high-order harmonic signals as well as the second harmonic signals may be used. The signals output at the fifth and sixth output terminals contain not only second harmonic signals but also high-order harmonic signals. Because high-order harmonic signals can be extracted when a filter is used, high-order harmonic signals other than the second harmonic signals may be output in place of the second harmonic signals to the frequency divider. In this embodiment, the example in which the second harmonic signals are output to the frequency divider has been however described because the signal amplitude of the second harmonic signals is larger than the signal amplitude of other high-order harmonic signals.

Third Embodiment

Figure 9:
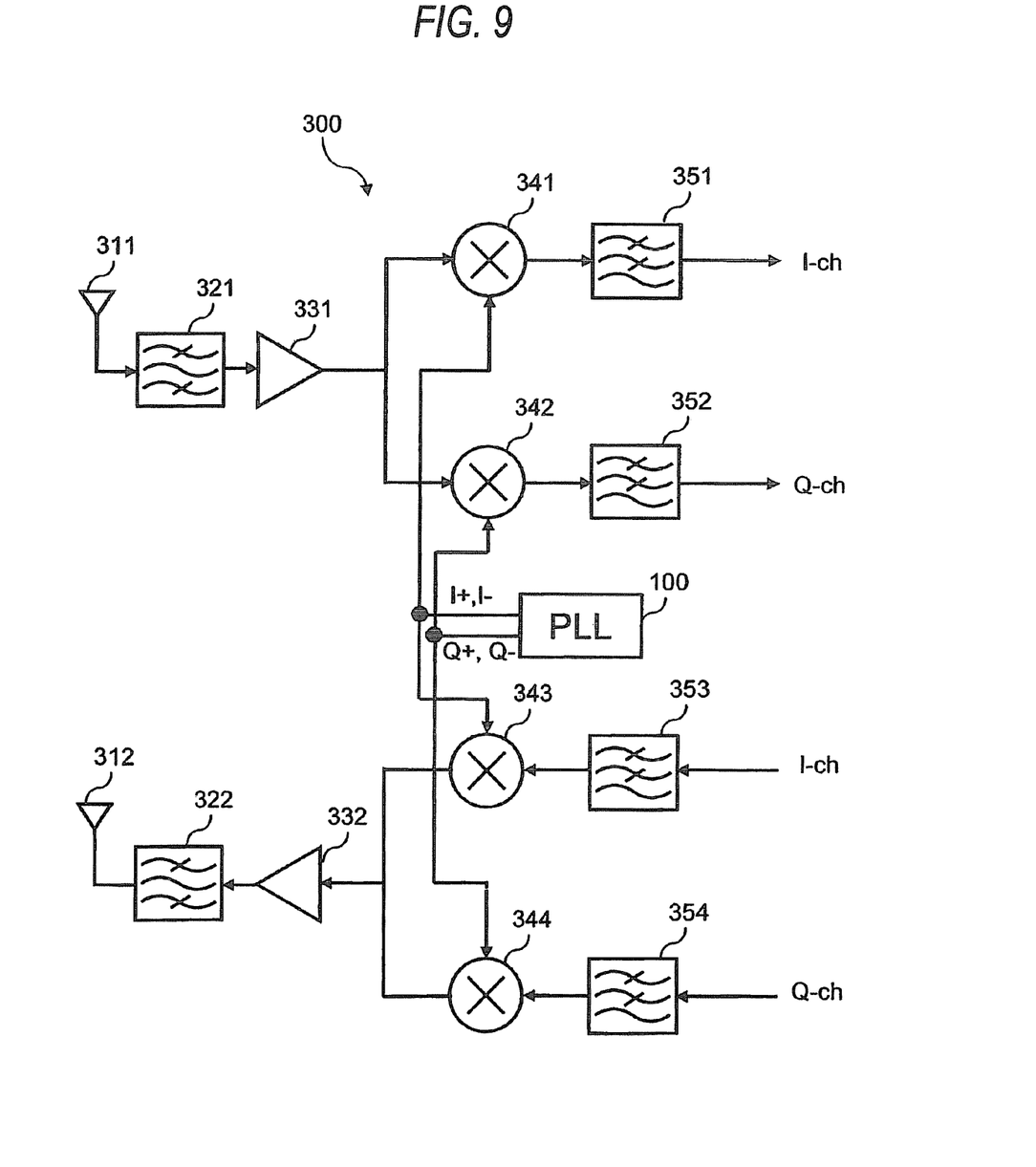
FIG. 9 is a block diagram showing a radio communication apparatus according to a third embodiment of the invention.

A third embodiment of the invention will be described next with reference to FIG. 9. In this embodiment, a radio communication apparatus 300 using the PLL circuit shown in FIG. 1 will be described. The radio communication apparatus 300 according to this embodiment has antennas 311 and 312, band-pass filters 321 and 322, a low noise amplifier 331, a power amplifier 332, mixers 341 to 344, low-pass filters 351 to 354, and the PLL circuit 100.

A receiving circuit of the radio communication apparatus 300 according to this embodiment will be described.

The antenna 311 receives a radio signal transmitted from a communication partner of the radio communication apparatus 300. The band-pass filter 321 extracts an RF signal of a desired bandwidth from the radio signal received through the antenna 311.

The low noise amplifier 331 amplifies the RF signal extracted by the band-pass filter 321. The mixer 341 generates a baseband (BB) signal (first reception signal) by multiplying the signal amplified by the low noise amplifier 331 by I+ and I− signals output from the PLL circuit 100. The mixer 342 generates a baseband (BB) signal (second reception signal) by multiplying the signal amplified by the low noise amplifier 331 by Q+ and Q− signals output from the PLL circuit 100.

The low-pass filters 351 and 352 extract signals with desired bandwidths from the BB signals generated by the mixers 341 and 342 respectively and generate an I-ch signal and a Q-ch signal respectively. The I-ch signal and the Q-ch signal are subjected to signal processing such as A/D conversion, demodulation, etc. so as to be converted into desired transmission data respectively. Description of the signal processing as post-processing will be omitted.

A transmitting circuit of the radio communication apparatus 300 will be described next. Although not shown in the drawings, transmission data to be transmitted to the communication partner of the radio communication apparatus 300 are subjected to signal processing such as modulation, D/A conversion, etc. so as to be converted into an I-ch signal (first transmission signal) and a Q-ch signal (second transmission signal) respectively.

The low-pass filters 353 and 354 extract signals with desired bandwidths from the Ich signal and the Q-ch signal and output the extracted signals to the mixers 343 and 344 following the low-pass filters 353 and 354, respectively. The mixer 343 generates a first product signal by multiplying the output signal of the low-pass filter 353 by I+ and I− signals output from the PLL circuit 100. The mixer 344 generates a second product signal by multiplying the output signal of the low-pass filter 354 by Q+ and Q− signals output from the PLL circuit 100.

The power amplifier 322 amplifies a sum signal obtained by adding up the first and second product signals and outputs the amplified signal to the band-pass filter 322. The band-pass filter 322 extracts a signal with a desired bandwidth from the amplified signal to transmit the extracted signal through the antenna 312.

Description of the PLL circuit 100 will be omitted because it has the same configuration as that of the PLL circuit 100 shown in FIG. 1.

As described above, in accordance with the third embodiment, the use of the PLL circuit 100 shown in FIG. 1 as a PLL circuit for a radio communication apparatus permits removal of any phase shifter required of the radio communication apparatus and accurate demodulation of a radio signal.

Because the PLL circuit 100 can output four-phase oscillation signals (I+, I−, Q+ and Q− signals) so that it is not necessary to 90 degrees phase-shift the oscillation signals any more, the phase shifter can be dispensed with. Moreover, because load conditions imposed on the respective output terminals for outputting the four-phase oscillation signals can be substantially equalized, phase error and amplitude error in each of the four-phase oscillation signals can be reduced. Accordingly, the phase difference between the I-ch signal and the Q-ch signal can be made close to 90 degrees, so that demodulation accuracy in the radio communication apparatus can be improved.

Although description has been made in the case where the PLL circuit 100 shown in FIG. 1 is applied to a direct conversion type radio communication apparatus by way of example, the PLL circuit 100 can be applied to another type radio communication apparatus such as a superheterodyne type radio communication apparatus, etc. than the direct conversion type radio communication apparatus.

Fourth Embodiment

Figure 10:
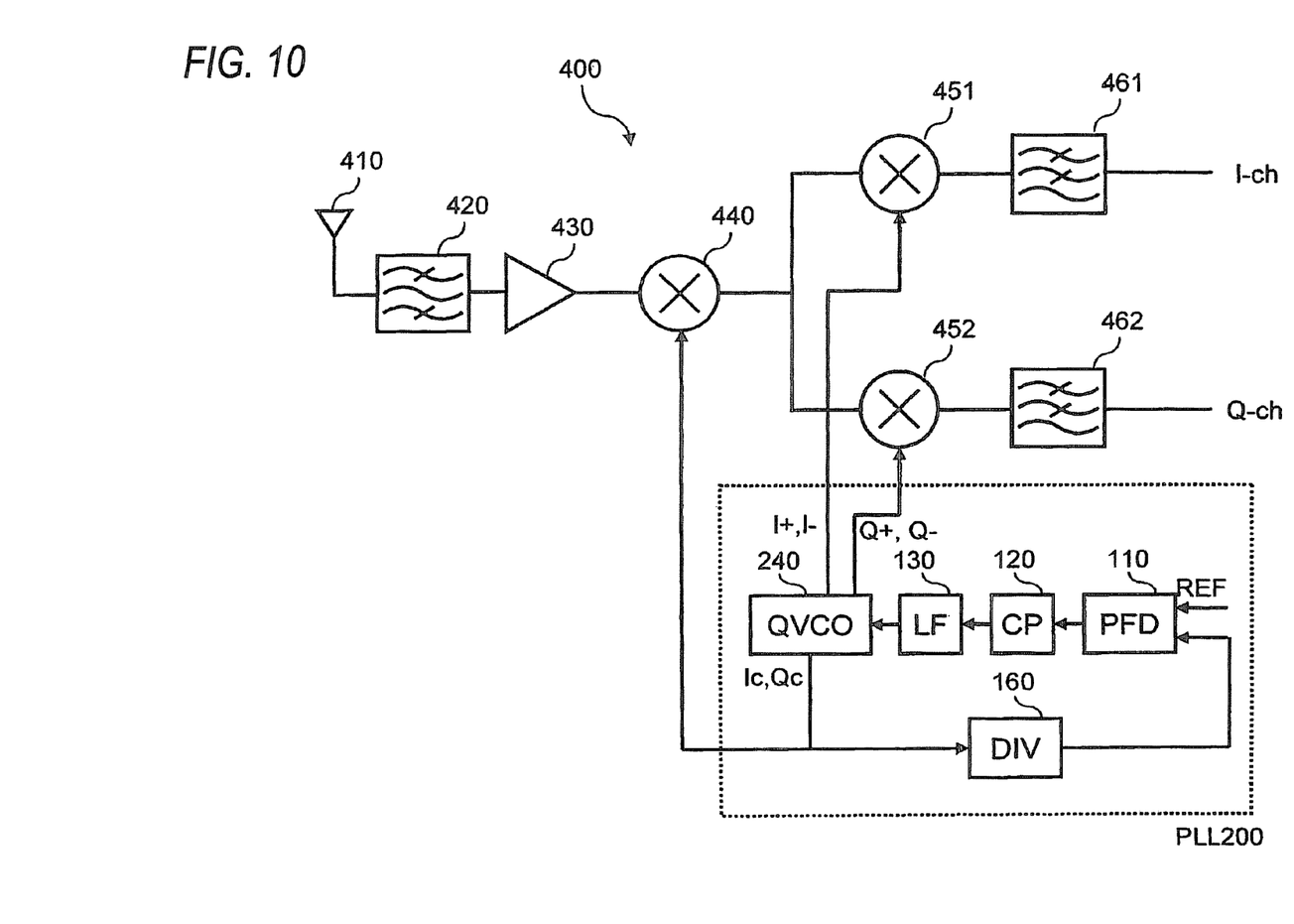
FIG. 10 is a block diagram showing a radio communication apparatus according to a fourth embodiment of the invention.

A fourth embodiment of the invention will be described next with reference to FIG. 10. In this embodiment, a radio communication apparatus 400 using the PLL circuit 200 shown in FIG. 6 will be described.

The radio communication apparatus 400 according to this embodiment has an antenna 410, a band-pass filter 420, a low noise amplifier 430, mixers 440, 451 and 452, low-pass filters 461 and 462, and the PLL circuit 200.

The antenna 410 receives a radio signal transmitted from a communication partner of the radio communication apparatus 400. The band-pass filter 420 extracts an RF signal of a desired bandwidth from the radio signal received through the antenna 410. The low noise amplifier 430 amplifies the RF signal extracted by the band-pass filter 420.

The mixer 440 multiplies the signal amplified by the low noise amplifier 430 by square signals Ic and Qc (third differential signals) output from the PLL circuit 200. As a result, the mixer 440 generates an IF signal.

The mixer 451 generates a baseband (BB) signal (first reception signal) by multiplying the IF signal by I+ and I− signals output from the PLL circuit 200. The mixer 452 generates a baseband (BB) signal (second reception signal) by multiplying the IF signal by Q+ and Q− signals output from the PLL circuit 200.

The low-pass filters 461 and 462 extract signals with desired bandwidths from the BB signals generated by the mixers 451 and 452 respectively and generate an I-ch signal and a Q-ch signal respectively. The I-ch signal and the Q-ch signal are subjected to signal processing such as A/D conversion, demodulation, etc. so as to be converted into desired transmission data respectively. Description of the signal processing as post-processing will be omitted.

The configuration of the PLL circuit 200 is substantially the same as that of the PLL circuit 200 shown in FIG. 6, except that the square signals Ic and Qc input to the frequency divider 160 are also input to the mixer 440. As shown in FIG. 8, the square signals Ic and Qc are differential signals with a frequency twice as much as the frequency of the I+, I−, Q+ and Q− signals (oscillation signals output from the PLL circuit). Accordingly, inputting the square signals Ic and Qc to the mixer 440 permits two-stage down conversion to be achieved by one PLL circuit.

Description will be made specifically in the case where a radio signal of 60 GHz is received by way of example. In this case, when the PLL circuit 200 outputs oscillation signals of 20 GHz, the square signals Ic and Qc are signals of 40 GHz. When the mixer 440 multiples the radio signal of 60 GHz by the square signals Ic and Qc of 40 GHz, an IF signal of 20 GHz is obtained. When the mixers 451 and 452 multiply the IF signal of 20 GHz by the oscillation signals (I+, I–, Q+ and Q– signals) of 20 GHz output from the PLL circuit 200, BB signals are obtained.

As described above, in accordance with the fourth embodiment, the use of the PLL circuit 200 shown in FIG. 6 as a PLL circuit for a radio communication apparatus permits removal of a plurality of oscillators in a radio system for performing two-stage down conversion and reduction in circuit scale of the radio communication apparatus in addition to the same effect as in the third embodiment. Although a radio communication apparatus using only one oscillator is known, a frequency divider is required for obtaining different oscillation signals on this occasion. In the radio communication apparatus according to this embodiment, it is however unnecessary to use such a frequency divider additionally.

Although here has been described an example that the PLL circuit 200 shown in FIG. 6 is applied to the receiving circuit of the radio communication apparatus for performing two-stage down conversion, the PLL circuit 200 can be applied to a transmitting circuit for performing two-stage up conversion. In addition, if second harmonic signals (square signals) are extracted from the oscillator 140 of the PLL circuit 100 shown in FIG. 1 in the same manner as the oscillator 240 shown in FIG. 7, the PLL circuit shown in FIG. 1 can be applied to the radio communication apparatus according to this embodiment.

Incidentally, the PLL circuit according to the first or second embodiment can be applied in the same manner as that according to the embodiment, not only to the radio communication apparatus according to this embodiment but also to another radio communication apparatus as long as the radio communication apparatus is a radio communication apparatus for performing two-stage down conversion.

It is to be understood that the invention is not limited to the specific embodiments described above and that the invention can be embodied with the components modified without departing from the spirit and scope of the invention. The invention can be embodied in various forms according to appropriate combinations of the components disclosed in the embodiments described above. For example, some components may be deleted from the configurations described as the embodiments. Further, the components described in different embodiments may be used appropriately in combination.

What is claimed is:

1. A PLL circuit comprising:
    a voltage-controlled oscillator comprising:
        a first oscillating portion configured to generate first differential signals; and
        a second oscillating portion configured to generate second differential signals with a phase difference of 90 degrees from the first differential signals;
    a phase detector configured to compare phases of third differential signals based on the first and second differential signals with a phase of a reference signal; and
    a loop filter configured to generate a control voltage for controlling the voltage-controlled oscillator based on a result of the comparison in the phase detector.

2. The PLL circuit of claim 1, wherein the third differential signals are a square signal of the first differential signals and a square signal of the second differential signals.

3. The PLL circuit of claim 1 further comprising a frequency divider configured to divide the frequency of the third differential signals,
    wherein the phase detector compares the third differential signals frequency-divided by the frequency divider with the reference signal.

4. The PLL circuit of claim 2, wherein each of the first and second oscillating portions has transistors, and
    wherein the square signal is generated at source terminals of the transistors.

5. The PLL circuit of claim 2, wherein the first oscillating portion comprises:
    a first output terminal at which a positive phase signal of the first differential signals is output;
    a second output terminal at which a negative phase signal of the first differential signals is output;
    a fifth output terminal at which the square signal of the first differential signals is output;
    a first resonance portion being connected to the first and second output terminals, the first resonance portion comprising inductors and capacitors and being configured to generate the first differential signals;
    a first MOS transistor comprising:
        a drain terminal connected to the first output terminal;
        a gate terminal connected to the second output terminal; and
        a source terminal connected to the fifth output terminal;
    a second MOS transistor comprising:
        a drain terminal connected to the second output terminal;
        a gate terminal connected to the first output terminal; and
        a source terminal connected to the fifth output terminal;
    a third MOS transistor comprising:
        a gate terminal supplied with a negative phase signal of the second differential signals; and
        a source terminal connected to the fifth output terminal; and
    a fourth MOS transistor comprising:
        a gate terminal supplied with a positive phase signal of the second differential signals; and
        a source terminal connected to the fifth output terminal,
    wherein the second oscillating portion comprises:
    a third output terminal at which a positive phase signal of the second differential signals is output;
    a fourth output terminal at which a negative phase signal of the second differential signals is output;
    a sixth output terminal at which the square signal of the second differential signals is output;
    a second resonance portion being connected to the third and fourth output terminals, the second resonance portion comprising inductors and capacitors and being configured to generate the second differential signals;
    a fifth MOS transistor comprising:
        a drain terminal connected to the third output terminal;
        a gate terminal connected to the fourth output terminal; and
        a source terminal connected to the sixth output terminal;
    a sixth MOS transistor comprising:
        a drain terminal connected to the fourth output terminal;
        a gate terminal connected to the third output terminal; and
        a source terminal connected to the sixth output terminal;

a seventh MOS transistor comprising:
  a gate terminal supplied with a positive phase signal of the first differential signals; and
  a source terminal connected to the sixth output terminal; and
an eighth MOS transistor comprising:
  a gate terminal supplied with a negative phase signal of the first differential signals; and
  a source terminal connected to the sixth output terminal.

6. The PLL circuit of claim 1 further comprising an adder configured to generate the third differential signals by adding up respective positive phase signals of the first and second differential signals and adding up respective negative phase signals of the first and second differential signals.

7. The PLL circuit of claim 1, wherein the first oscillating portion comprises:
  a first output terminal at which a positive phase signal of the first differential signals is output;
  a second output terminal at which a negative phase signal of the first differential signals is output;
  a first resonance portion being connected to the first and second output terminals, the first resonance portion comprising inductors and capacitors and being configured to generate the first differential signals;
  a first MOS transistor comprising:
    a drain terminal connected to the first output terminal; and
    a gate terminal connected to the second output terminal;
  a second MOS transistor comprising:
    a drain terminal connected to the second output terminal; and
    a gate terminal connected to the first output terminal;
  a third MOS transistor comprising a gate terminal supplied with a negative phase signal of the second differential signals; and
  a fourth MOS transistor comprising a gate terminal supplied with a positive phase signal of the second differential signals, and
  wherein the second oscillating portion comprises:
  a third output terminal at which a positive phase signal of the second differential signals is output;
  a fourth output terminal at which a negative phase signal of the second differential signals is output;
  a second resonance portion being connected to the third and fourth output terminals, the second resonance portion comprising inductors and capacitors and being configured to generate the second differential signals;
  a fifth MOS transistor comprising:
    a drain terminal connected to the third output terminal; and
    a gate terminal connected to the fourth output terminal;
  a sixth MOS transistor comprising:
    a drain terminal connected to the fourth output terminal; and
    a gate terminal connected to the third output terminal;
  a seventh MOS transistor comprising a gate terminal supplied with a positive phase signal of the first differential signals; and
  an eighth MOS transistor comprising a gate terminal supplied with a negative phase signal of the first differential signals.

8. A radio communication apparatus comprising:
an antenna configured to receive a radio signal;
an amplifier configured to generate an amplified signal by amplifying the radio signal;
a PLL circuit comprising:
  a voltage-controlled oscillator comprising:
    a first oscillating portion configured to generate first differential signals; and
    a second oscillating portion configured to generate second differential signals with a phase difference of 90 degrees from the first differential signals;
  a phase detector configured to compare phases of third differential signals based on the first and second differential signals with a phase of a reference signal; and
  a loop filter configured to generate a control voltage for controlling the voltage-controlled oscillator based on a result of the comparison in the phase detector;
a first mixer circuit configured to generate a first reception signal by multiplying the amplified signal by the first differential signals; and
a second mixer circuit configured to generate a second reception signal by multiplying the amplified signal by the second differential signals.

9. The radio communication apparatus of claim 8, wherein the PLL circuit generates a square signal of the first differential signals and a square signal of the second differential signals,
  wherein the radio communication apparatus further comprises a third mixer circuit configured to generate intermediate-frequency signals as differential signals by multiplying the amplified signal by the square signals of the first and second differential signals respectively, and
  wherein the first and second mixer circuits generate the first and second reception signals by multiplying the intermediate-frequency signals by the first and second differential signals respectively.

10. The radio communication apparatus of claim 8, wherein each of the first and second oscillating portions of the PLL circuit comprises transistors, and
  wherein the square signal is generated at source terminals of the transistors in each oscillating portion.

11. The radio communication apparatus of claim 9, wherein the first oscillating portion comprises:
  a first output terminal at which a positive phase signal of the first differential signals is output;
  a second output terminal at which a negative phase signal of the first differential signals is output;
  a fifth output terminal at which the square signal of the first differential signals is output;
  a first resonance portion being connected to the first and second output terminals, the first resonance portion comprising inductors and capacitors and being configured to generate the first differential signals;
  a first MOS transistor comprising:
    a drain terminal connected to the first output terminal;
    a gate terminal connected to the second output terminal; and
    a source terminal connected to the fifth output terminal;
  a second MOS transistor comprising:
    a drain terminal connected to the second output terminal;
    a gate terminal connected to the first output terminal; and
    a source terminal connected to the fifth output terminal;
  a third MOS transistor comprising:
    a gate terminal supplied with a negative phase signal of the second differential signals; and
    a source terminal connected to the fifth output terminal; and
  a fourth MOS transistor comprising:
    a gate terminal supplied with a positive phase signal of the second differential signals; and a source terminal connected to the fifth output terminal, and wherein the second oscillating portion comprises:

a third output terminal at which a positive phase signal of the second differential signals is output;

a fourth output terminal at which a negative phase signal of the second differential signals is output;

a sixth output terminal at which the square signal of the second differential signals is output;

a second resonance portion being connected to the third and fourth output terminals, the second resonance portion comprising inductors and capacitors and being configured to generate the second differential signals;

a fifth MOS transistor comprising:
 a drain terminal connected to the third output terminal;
 a gate terminal connected to the fourth output terminal; and
 a source terminal connected to the sixth output terminal;

a sixth MOS transistor comprising:
 a drain terminal connected to the fourth output terminal;
 a gate terminal connected to the third output terminal; and
 a source terminal connected to the sixth output terminal;

a seventh MOS transistor comprising:
 a gate terminal supplied with a positive phase signal of the first differential signals; and
 a source terminal connected to the sixth output terminal; and an eighth MOS transistor comprising:
 a gate terminal supplied with a negative phase signal of the first differential signals; and
 a source terminal connected to the sixth output terminal.

* * * * *